(12) United States Patent
Miks et al.

(10) Patent No.: US 7,095,103 B1
(45) Date of Patent: Aug. 22, 2006

(54) LEADFRAME BASED MEMORY CARD

(75) Inventors: Jeffrey Alan Miks, Chandler, AZ (US); Curtis Michael Zwenger, Chandler, AZ (US); Ziehl-Neelsen L. Co, Santa Rosa (PH)

(73) Assignee: Amkor Technology, Inc., Chandler, AZ (US)

( * ) Notice: Subject to any disclaimer, the term of this patent is extended or adjusted under 35 U.S.C. 154(b) by 365 days.

(21) Appl. No.: 10/427,117

(22) Filed: May 1, 2003

(51) Int. Cl.
H01L 23/02 (2006.01)

(52) U.S. Cl. ...................... 257/679; 257/676

(58) Field of Classification Search ................ 257/676, 257/679, 666
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,646,710 A | 3/1987 | Schmid et al. | |
| 4,707,724 A | 11/1987 | Suzuki et al. | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,029,386 A | 7/1991 | Chao et al. | |
| 5,041,902 A | 8/1991 | McShane | |

(Continued)

FOREIGN PATENT DOCUMENTS

DE 19734794 A1 8/1997

(Continued)

OTHER PUBLICATIONS

JEDEC Solid State Product Outline, "2 Lead Header Family Surface Mounted (Peripheral Terminals)", 4 pages.

(Continued)

Primary Examiner—David A. Zarneke
(74) Attorney, Agent, or Firm—Stetina Brunda Garred & Brucker

(57) ABSTRACT

A media card comprising a leadframe having first and second die pads, a plurality of contacts, and a plurality of conductive traces extending from respective ones of the contacts towards the first and second die pads. The second die pad is bent in a manner facilitating the formation of a cavity therein. Attached to the first die pad is a semiconductor die which is electrically connected to the leadframe. Disposed within the cavity and electrically connected to the leadframe is an electronic component. A body at least partially encapsulates the leadframe, the semiconductor die and the electronic component such that the contacts are exposed in the bottom surface defined by the body. The electronic component is shielded from radio frequency as a result of its receipt into the cavity defined by the second die pad of the lead frame.

20 Claims, 4 Drawing Sheets

U.S. PATENT DOCUMENTS

| | | |
|---|---|---|
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasarathi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,479 A | 1/1999 | David |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,474 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |

| | | | |
|---|---|---|---|
| 6,133,623 A | 10/2000 | Otsuki et al. | |
| 6,140,154 A | 10/2000 | Hinkle et al. | |
| 6,143,981 A | 11/2000 | Glenn | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,239,384 B1 | 5/2001 | Smith et al. | |
| 6,242,281 B1 | 6/2001 | Mclellan et al. | |
| 6,256,200 B1 | 7/2001 | Lam et al. | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,339,255 B1 | 1/2002 | Shin | |
| 6,355,502 B1 | 3/2002 | Kang et al. | |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 | 6/2002 | Fan et al. | |
| 6,414,385 B1 | 7/2002 | Huang et al. | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B1 | 9/2002 | Shimoda | |
| 6,464,121 B1 | 10/2002 | Reijnders | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B1 | 12/2002 | Azuma | |
| 6,507,120 B1 | 1/2003 | Lo et al. | |
| 6,559,525 B1 | 5/2003 | Huang | |
| 6,624,005 B1 | 9/2003 | DiCaprio et al. | |
| 2001/0008305 A1 | 7/2001 | McLellan et al. | |
| 2001/0014538 A1 | 8/2001 | Kwan et al. | |
| 2002/0011654 A1 | 1/2002 | Kimura | |
| 2002/0024122 A1 | 2/2002 | Jung et al. | |
| 2002/0140061 A1 | 10/2002 | Lee | |
| 2002/0140068 A1 | 10/2002 | Lee et al. | |

FOREIGN PATENT DOCUMENTS

| | | |
|---|---|---|
| EP | 54021117 | 6/1979 |
| EP | 59050939 | 3/1984 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150765 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummala & E. Rymaszewski, published by Van Nostrand Reinhold, New York, NY.

National Semiconductor Application Note 1187, "Leadless Leadframe Package (LLP)", Oct., 2002, http://www.national.com/an/AN/AN-1187 pdt.

Vishay Siliconix Press Release, http://www.siliconix.com/www/200/pr98/4430 html . Dec. 9, 1998, pp. 1-3.

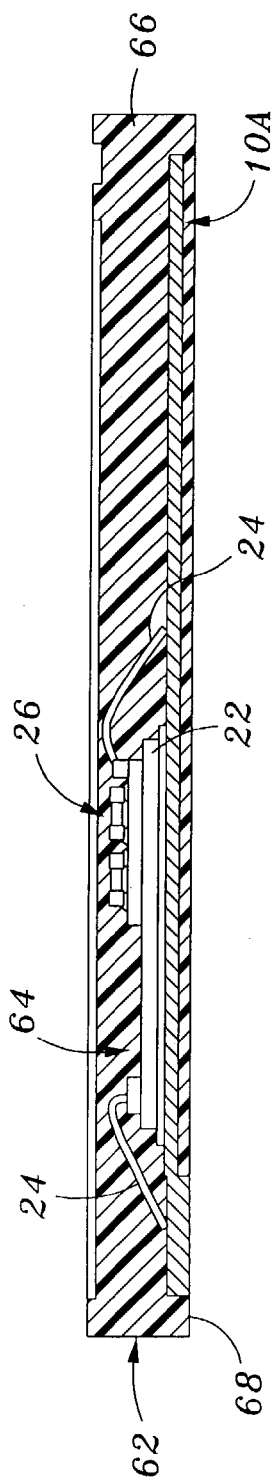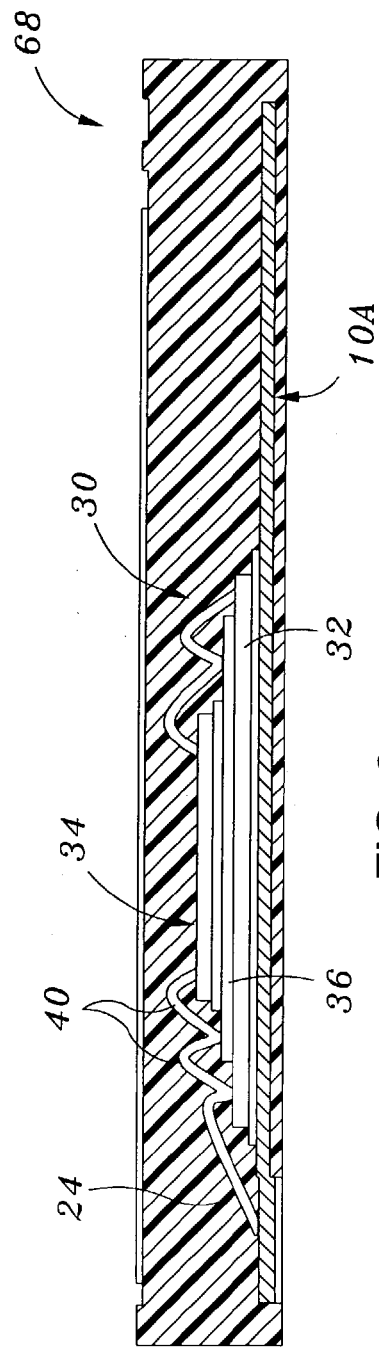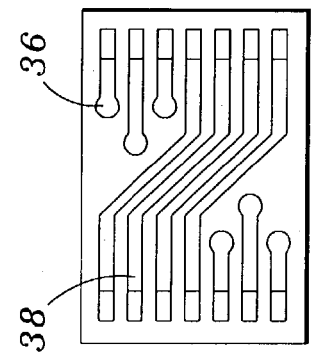

LEADFRAME BASED MEMORY CARD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to media cards and, more particularly, to a leadframe based multi-media card having chip array, land grid array, and/or service mount technology like structures mounted to the leadframe using standard processing and equipment.

As is well known in the electronics industry, circuit modules or media cards are being used in increasing numbers to provide memory storage and other electronic functions for devices such as digital cameras, MP3 players, cellular phones, and personal digital assistants. In this regard, circuit modules are currently used in various memory card formats, including multi-media cards (MMC), secure digital cards (SDC), compact flash (CF), smart media, and memory stick.

Typically, circuit modules include multiple integrated circuit devices or semiconductor dies. The dies are interconnected using a circuit board substrate which adds to the weight, thickness, stiffness and complexity of the module. Circuit modules also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the circuit module and, hence, the memory card using the same, there has been developed by Applicant a circuit module wherein a leadframe assembly is used as an alternative to the circuit board substrate, as described in Applicant's co-pending U.S. application Ser. No. 09/956,190 entitled LEAD-FRAME METHOD AND ASSEMBLY FOR INNERCONNECTING CIRCUITS WITHIN A CIRCUIT MODULE filed Sep. 19, 2001 and Ser. No. 10/266,329 entitled DIE DOWN MULTI-MEDIA CARD AND METHOD OF MAKING SAME filed Oct. 8, 2002, the disclosures of which are incorporated herein by reference.

In certain multi-media card or secure digital card applications, it is desirable to mount or electrically connect passive structures such as chip array (CA), land grid array (LGA), and/or surface mount technology (SMT) like structures to the leadframe of the multi-media card. The inclusion of the CA, LGA and/or SMT structures typically requires that the traditional laminate circuit board substrate be employed in the multi-media card in lieu of the leadframe. However, the inclusion of the laminate circuit board substrate increases the number of process steps in the fabrication of the multi-media card, and thus increases the overall production cost. The present invention addresses this deficiency by providing a leadframe based multi-media card which is adapted to allow CA, LGA, and/or SMT structures to be mounted to the leadframe using standard D/A or standard W/B processing and equipment.

BRIEF SUMMARY OF THE INVENTION

In accordance with the present invention, there is provided a media card comprising a lead frame having first and second die pads, a plurality of contacts, and a plurality of conductive traces which extend from respective ones of the contacts towards the first and second die pads. The second die pad is bent in a manner facilitating the formation of a cavity therein. Attached to the first die pad is a semiconductor die which is connected to the leadframe. Additionally, disposed within the cavity and electrically connected to the leadframe is an electronic component. A body at least partially encapsulates the leadframe, the semiconductor die and the electronic component such that the contacts are exposed in a bottom surface defined by the body. The electronic component is itself shielded from radio frequency as a result of its receipt into the cavity defined by the second die pad of the leadframe. The electronic component may comprise a surface mount technology subassembly, a chip array structure, or a land grid array structure.

In other embodiments of the present invention, the leadframe may be modified to include only a single die pad having a die stack attached thereto and electrically connected to the leadframe. One such die stack may include an interposer which is disposed between a pair of dies and configured to facilitate a desired pattern of electrical connection therebetween. The configurations of the various embodiments of the multi-media card of the present invention are adapted to provide a leadframe based card which is suited to allow CA, LGA, and/or SMT structures to be mounted to the leadframe using standard D/A or standard W/P processing and equipment.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 5 is a cross-sectional view of a multi-media card constructed in accordance with a fourth embodiment of the present invention;

FIG. 6 is a cross-sectional view of a multi-media card constructed in accordance with a fifth embodiment of the present invention; and FIG. 7 is a top plan view of an interposer included in the multi-media card of the fifth embodiment shown in FIG. 6.

DETAILED DESCRIPTION OF THE INVENTION

Figure 1:
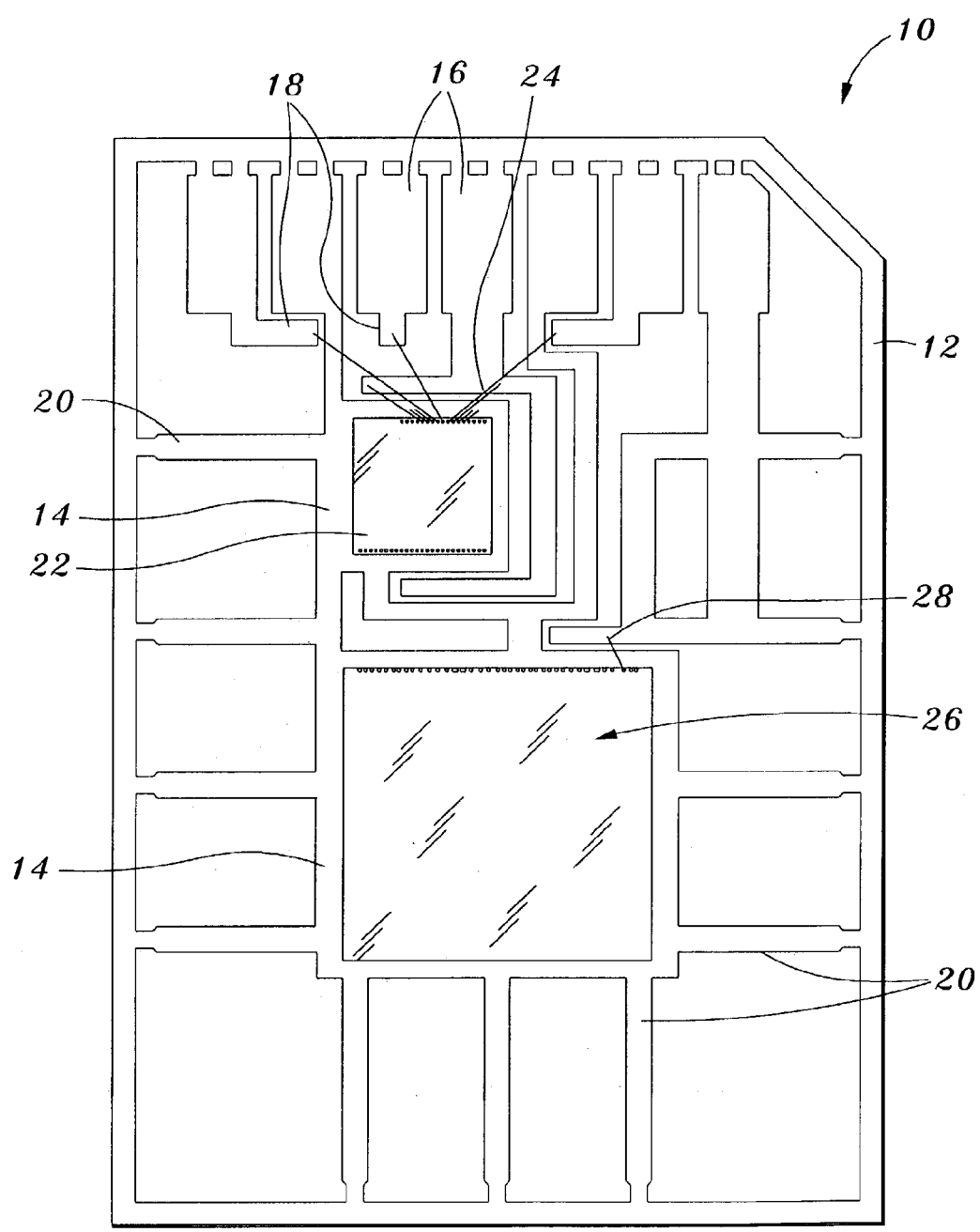
FIG. 1 is a top plan view of an exemplary leadframe which may be incorporated into various embodiments of a multi-media card constructed in accordance with the present invention.

Referring now to the drawings wherein the showings are for purposes of illustrating preferred embodiments of the present invention only, and not for purposes of limiting the same, FIG. 1 depicts exemplary leadframe 10 which may be included in various embodiments of a multi-media card constructed in accordance with the present invention, as will be described in more detail below. The leadframe 10 comprises an outer frame or dambar 12. The dambar 12 has a generally rectangular configuration defining an opposed pair of longitudinal sides or segments and an opposed pair of lateral sides or segments. The dambar 12 further defines a fifth sloped side which extends angularly between one of the lateral sides and one of the longitudinal sides thereof.

In addition to the dambar 12, the leadframe 10 includes a pair of die attach areas or pads 14 which are disposed within the interior of the dambar 12. The die pads 14 each define opposed generally planar top and bottom surfaces. Integrally connected to and extending from one lateral side of the dambar 12 is a plurality of contacts 16. Each of the contacts 16 also defines opposed, generally planar top and bottom surfaces. Integrally connected to and extending from each of the contacts 16 is a conductive trace 18. The traces 18 terminate in close proximity to respective ones of the die pads 14. Tie bars 20 are used to integrally connect the die pads 14 to one or more of the longitudinal and lateral sides of the dambar 12. The leadframe 10 is preferably fabricated from a conductive metal material (e.g., copper) through either a chemical etching or mechanical stamping process. Importantly, the metal material used to fabricate the leadframe 10 is preferably partially etched in a manner wherein the thickness of the contacts 16 exceeds that of the remainder of the leadframe 10. In this regard, in the leadframe 10, the top surfaces of the contacts 16 preferably extend in substantially co-planar relation to the top surfaces of the die pads 14, traces 18 and tie bars 20 of the leadframe 10. In contrast, the bottom surfaces of the die pads 14, traces 18 and tie bars 20 are perpendicularly recessed relative to the bottom surfaces of the contacts 16 as a result of the half-etching of the leadframe 10. The purpose for the increased thickness of the contacts 16 in comparison to the die pads 14, traces 18 and tie bars 20 will be described in more detail below.

In FIG. 1, an exemplary semiconductor die 22 is depicted as being mounted to the top surface of the die pad 14 which is disposed closest to the contacts 16. The conductive pads or terminals of the semiconductor die 22 are further shown as being electrically connected to certain ones of the traces 18 via conductive wires 24. As further shown in FIG. 1, an exemplary surface mount technology (SMT) subassembly 26 is shown as being mounted to the top surface of the die pad 14 disposed furthest from the contacts 16. The SMT subassembly 26 will typically comprise a laminate substrate having one or more passive devices which are mounted to the top surface of the substrate and electrically connected to conductive traces included thereon. In FIG. 1, the SMT subassembly 26 is shown as being electrically connected to a trace 18 of the leadframe 10 via an exemplary conductive wire 28. Those of ordinary skill in the art will recognize that any number of conductive wires 24, 28 may be used to electrically connect the semiconductor die 22 and SMT subassembly 26 to the traces 18 of the leadframe 10.

Figure 1A:
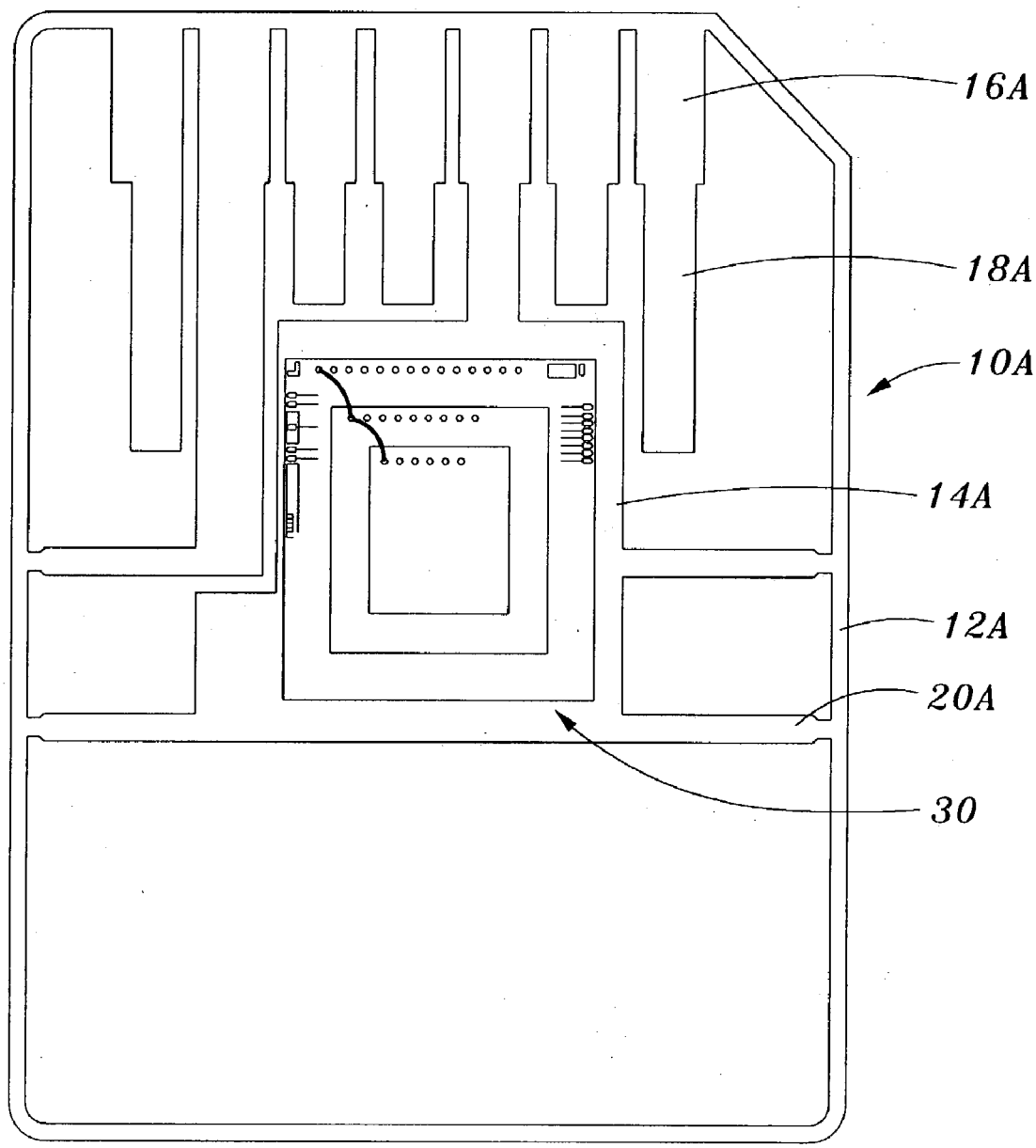
FIG. 1A is a top plan view of an alternative leadframe which may be incorporated into various embodiments of a multi-media card constructed in accordance with the present invention.

Referring now to FIG. 1A, there is shown a leadframe 10A which may also be used in certain embodiments of the multi-media card which will be described below. The leadframe 10A itself comprises an outer frame or dambar 12A which has a generally rectangular configuration defining an opposed pair of longitudinal sides or segments and an opposed pair of lateral sides or segments. The dambar 12A further defines a fifth sloped side which extends angularly between one of the lateral sides and one of the longitudinal sides thereof.

In addition to the dambar 12A, the leadframe 10A includes a single die attach area or die pad 14A which is disposed within the interior of the dambar 12A. The die pad 14A defines opposed, generally planar top and bottom surfaces. Integrally connected to and extending inwardly from one lateral side of the dambar 12A are a plurality of contacts 16A of the leadframe 10A. Each of the contacts 16A also defines opposed, generally planar top and bottom surfaces. Integrally connected to and extending from each of the contacts 16A is a conductive trace 18A. As seen in FIG. 1A, at least one of the traces 18A extends and is integrally connected to the die pad 14A. Additionally, at least one trace 18A extends and is integrally connected to one of the longitudinal sides of the dambar 12A. In addition to being supported by one of the traces 18A, the die pad 14A is also supported within the interior of the dambar 12A by a plurality of tie bars 18A which are integrally connected to and extend between the die pad 14A and respective ones of the longitudinal sides of the dambar 12A.

Like the leadframe 10 described above, the leadframe 10A is also preferably fabricated from a conductive metal material such as copper through either a chemical etching or mechanical stamping process. Additionally, it is contemplated that at least one side of the leadframe 10A will be subjected to a partial etching process for purposes of causing at least the die pad 14A, traces 18A, and tie bars 20A to be of reduced thickness as compared to the contacts 16A. Thus, the top surfaces of the contacts 16A will extend in generally co-planar relation to the top surfaces of the die pad 14A, traces 18A, and tie bars 20A. However, the bottom surfaces of the die pad 14A, traces 18A, and tie bars 20A will be offset or perpendicularly recessed relative to the bottom surfaces of the contacts 16A. As is apparent from the foregoing, the primary distinction between the leadframes 10, 10A is the inclusion of only a single die pad 14A in the leadframe 10A, as compared to the two die pads 14 included in the leadframe 10.

In FIG. 1A, a die stack 30 is shown as being mounted to the top surface of the die pad 14A. As best seen in FIGS. 6 and 7, the die stack 30 comprises a first semiconductor die 32 which defines opposed, generally planar top and bottom surfaces, and includes a plurality of pads or terminals on the top surface thereof in close proximity to its peripheral edge. In addition to the first semiconductor die 32, the die stack 30 includes a second semiconductor die 34. In the die stack 30, an interposer 36 (shown in FIG. 7) is mounted to the top surface of the semiconductor die 32. The interposer 36 itself defines opposed, generally planar top and bottom surfaces. Included on the interposer 36 are a plurality of conductive traces 38 which are arranged in a prescribed pattern. Mounted to that side or face of the interposer 36 opposite that mounted to the semiconductor die 32 is the second semiconductor die 34 of the die stack 30. As best seen in FIG. 6, the interposer 36 disposed or captured between the first and second semiconductor dies 32, 34 allows the second semiconductor die 34 to be placed into electrical connection or communication with the first semiconductor die 32 in a prescribed manner through the use of conductive wires 40 which are extended from the second semiconductor die 34 to the interposer 36, and from the interposer 36 to the first semiconductor die 32. Thus, the die stack 30 comprises the combination of the first semiconductor die 32, the second semiconductor die 34, interposer 36 and wires 40.

In the leadframe 10 shown in FIG. 1, the die pad 14 disposed furthest from the contacts 16 is shown as having a size larger than that of the die pad 14 disposed closest to the contacts 16. Those of ordinary skill in the art will recognize that the reverse may be true, with the size of the die pad 14 disposed closest to the contacts 16 exceeding that of the remaining die pad 14. Additionally, the conductive traces 18 need not necessarily be provided in the exact same pattern as shown in FIG. 1, but rather may be provided in any one of a wide range of patterns depending on the desired application for the multi-media card including the leadframe 10. Similarly, in the leadframe 10A shown in FIG. 1A, the size of the die pad 14A may vary from that shown, as may the pattern of the conductive traces 18A.

Figure 2:
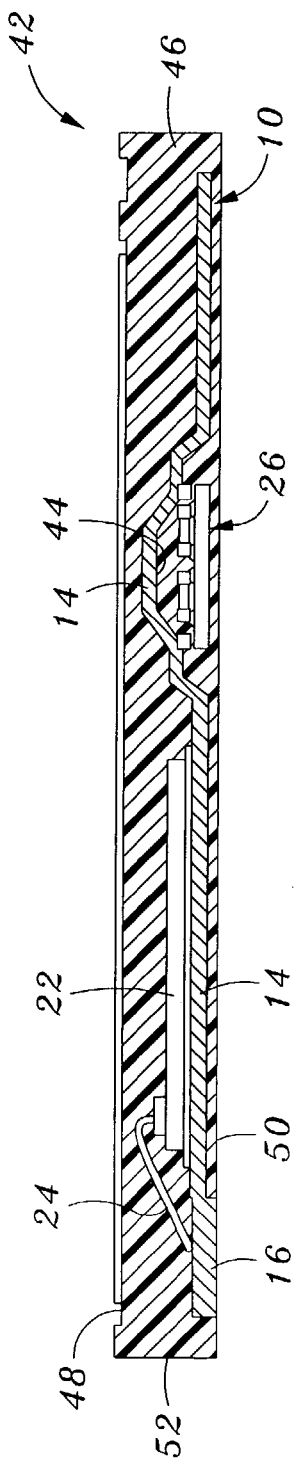
FIG. 2 is a cross-sectional view of a multi-media card constructed in accordance with a first embodiment to the present invention.

Referring now to FIG. 2, there is shown a multi-media card 42 constructed in accordance with a first embodiment of the present invention. The multi-media card 42 includes the leadframe 10 as modified such that the die pad 14 disposed closest to the contacts 16 exceeds the size of the remaining die pad 14. Leadframe 10 of the multi-media card 42 is further modified in that the die pad 14 disposed furthest from the contacts 16 is subjected to a bending or stamping operation which facilitates the formation of a recess or cavity 44 in the bottom surface of such die pad 14.

In addition to the leadframe 10, the multi-media card 42 comprises the above-described semiconductor die 22 which is mounted to the top surface of the die pad 14 disposed closest to the contacts 16. The pads or terminals of the semiconductor die 22 are electrically connected to one or more of the traces 18 via the above-described conductive wires 24. In addition to the semiconductor die 22, the multi-media card 42 includes the above-described SMT subassembly 26. However, the SMT subassembly 26 is not mounted to the top surface of the die pad 14 disposed furthest from the contacts 16. Rather, the SMT subassembly 26 is positioned within the cavity 44 formed within such die pad 14 in the manner shown in FIG. 2. Upon being positioned within the cavity 44, the SMT subassembly 26 of the multi-media card 42 is placed into direct electrical connection or communication with the corresponding die pad 14 itself and/or one or more of the traces 18 extending to the bent die pad 14. Importantly, the depth and configuration of the cavity 44 is selected relative to the SMT subassembly 26 such that when the SMT subassembly 26 is electrically connected to the leadframe 10, the bottom surface of the substrate of the SMT subassembly 26 extends in generally co-planar relation to the bottom surface of the die pad 14 having the semiconductor die 22 mounted to the top surface thereof. Thus, due to the preferred configuration of the leadframe 10, the bottom surface of the substrate of the SMT subassembly 26 further extends in substantially co-planar relation to the bottom surfaces of the traces 18 and tie bars 20 of the leadframe 10.

Subsequent to the electrical connection of the semiconductor die 22 and SMT subassembly 26 to the leadframe 10 in the above-described manner, an encapsulant material is applied to the leadframe 10, semiconductor die 22, SMT subassembly 26, and conductive wires 24. The encapsulant material is preferably a plastic (e.g., thermoset, thermoplastic) which, upon hardening, forms a body 46 of the multi-media card 42. The body 46 is formed to provide the necessary form factor for the multi-media card 42. The body 46 defines a generally planar top surface 48, an opposed, generally planar bottom surface 50, and side surfaces 52 which extend generally perpendicularly between the top and bottom surfaces 48, 50. In the completed body 46, the bottom surfaces of the contacts 16 of the leadframe 10 are exposed in and generally flush with the bottom surface 50 of the body 46. Subsequent to the formation of the body 46, the leadframe 10 is singulated as needed to facilitate the electrical isolation of the traces 18 and hence the contacts 16 of the leadframe 10 from each other. In this regard, the body 46 is formed such that the dambar 12 of the leadframe 10 is exposed, thus allowing for the removal of the same from the multi-media card 42.

Those of ordinary skill in the art will recognize that the body 46 may be formed to have a form factor for a memory card other than the multi-media card 42 shown in FIG. 6, e.g., a secure digital card. In this regard, insert molding using plastic molding processing techniques may be used to facilitate the encapsulation of the leadframe 10, semiconductor die 22, SMT subassembly 26 and conductive wires 24 to produce a media card in any form factor. In the case of insert molding a media card, a module (e.g., the combination of the leadframe 10, semiconductor die 22, SMT subassembly 26 and conductive wires 24) is first placed into a mold cavity shaped for a certain form factor. The mold is then closed onto the module, with a polymeric material then being injected around the module. The polymeric matrix resin could be of thermoplastic, rubber, thermoset or any combination of these materials. Possible form factors include memory and I/O cards including multi-media cards, secure digital cards, thin secure digital cards, compact flash cards, and other small form factor media cards. The plastic processing techniques that could be employed in relation to the formation of the body include injection molding, resin transfer molding, infusion molding, reaction injection molding, and each of their variations. As indicated above, these processes can be used in conjunction with the insertion of a module into a mold to facilitate the manufacture of media cards with the least amount of downstream automated handling. The end product of the process involving the encapsulation of the module inserted into the mold is a plastic surrounded electronics module having a certain form factor. This particular manufacturing solution can be used to alleviate the need for a separate lid or skin joined to a body through the use of adhesive as is the case with many conventional, prior art media cards.

Advantageously, in the multi-media card 42 shown in FIG. 2, the SMT subassembly 26, in addition to being encapsulated by the material used to form the package body 46, is further covered or shielded by the corresponding bent die pad 14 of the leadframe 10. In this regard, the receipt of the SMT subassembly 26 into the cavity 44 effectively provides an RF (radio frequency) shield for the SMT subassembly 26. It is contemplated that in the multi-media card 42, other components may be substituted for the SMT subassembly 26. For example, it is contemplated that the SMT subassembly 26 may be substituted with either a chip array (CA) structure or a land grind array (LGA) structure. The CA structure or LGA structure differs from the SMT subassembly 26 in that the passive components of the CA or LGA structure are themselves typically covered or encapsulated with a package body. It will be recognized that if a CA or LGA structure is used in the multi-media card 42, the package body of such structure will necessarily be sized and configured to be receivable into the cavity 44 in the same manner described above in relation to the SMT subassembly 26. In addition, the CA or LGA structure will be configured in a manner adapted to allow for the electrical connection thereof to the leadframe 10 in the same manner described above in relation to the SMT subassembly 26.

Figure 3:
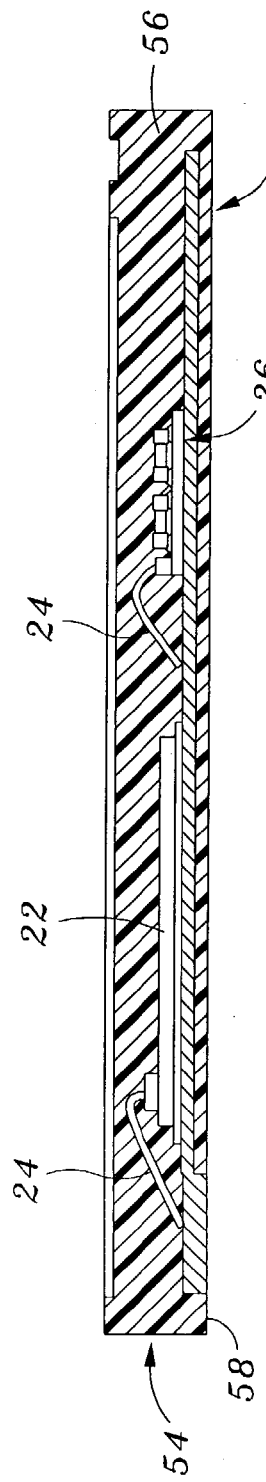
FIG. 3 is a cross-sectional view of a multi-media card constructed in accordance with a second embodiment of the present invention.

Referring now to FIG. 3, there is shown multi-media card 54 constructed in accordance with a second embodiment of the present invention. The multi-media card 54 includes the leadframe 10 as modified such that the die pad 14 disposed closest to the contacts 16 exceeds the size of the remaining die pad 14. In addition to the leadframe 10, the multi-media card 54 comprises the above-described semiconductor die 22 which is mounted to the top surface of the die pad 14 disposed closest to the contacts 16. The pads or terminals of the semiconductor die 22 are electrically connected to one or more of the traces 18 via the above-described conductive wire(s) 24. In addition to the semiconductor die 22, the multi-media card 54 includes the above-described SMT subassembly 26. The SMT subassembly 26 is mounted to the top surface of the die pad 14 disposed furthest from the contacts 16. At least one conductive wire 24 is also used to electrically connect a pad or terminal of the substrate of the SMT subassembly 26 to at least one of the conductive traces 18 of the leadframe 10. Thus, in the multi-media card 54, the semiconductor die 22 and SMT subassembly 26 are disposed in a side-by-side configuration upon the leadframe 10.

Subsequent to the electrical connection of the semiconductor die 22 and SMT subassembly 26 to the leadframe 10 in the above-described manner, an encapsulant material is applied to the leadframe 10, semiconductor die 22, SMT subassembly 26, and conductive wires 24. The hardening of the encapsulant material facilitates the formation of a body 56 of the multi-media card 54 which has the same structural attributes described above in relation to the body 46 of the multi-media card 42. Subsequent to the formation of the body 56, the leadframe 10 is singulated as described above in relation to the multi-media card 42 for purposes of electrically isolating the traces 18 and contacts 16 of the leadframe 10 from each other. In the completed body 56, the bottom surfaces of the contacts 16 of the leadframe 10 are exposed in and substantially flush with the bottom surface 58 of the body 56.

It is contemplated that, as an alternative to the leadframe 10, the multi-media card 54 may be fabricated through the use of the leadframe 10A. In this regard, both the semiconductor die 22 and SMT subassembly 26 would each be mounted to the top surface of the sole die pad 14A of the leadframe 10A. Subsequent to such mounting, the conductive wires 24 would be used to electrically connect the pads or terminals of the semiconductor die 22 and the substrate of the SMT subassembly 26 to respective ones of the traces 18A of the leadframe 10A. Despite the substitution of the leadframe 10 with the leadframe 10A, the body 56 of the multi-media card 54 would still be formed in the above-described manner.

Figure 4:
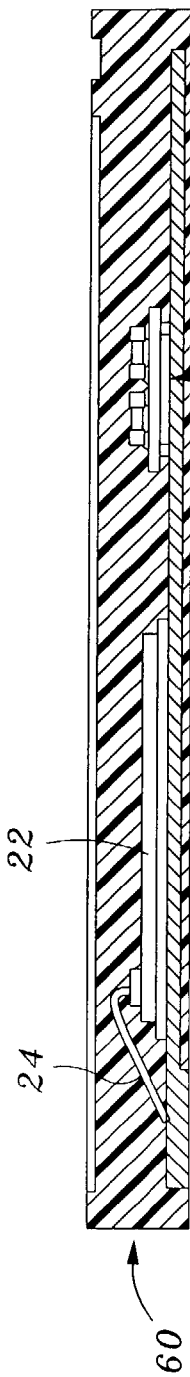
FIG. 4 is a cross-sectional view of a multi-media card constructed in accordance with a third embodiment of the present invention.

Referring now to FIG. 4, there is shown a multi-media card 60 constructed in accordance with a third embodiment of the present invention. The multi-media card 60 is substantially similar in construction to the above-described multi-media card 54, except that a direct conductive bond is created between the SMT subassembly 26 of the multi-media card 60 and the leadframe 10, 10A, as opposed to conductive wires 24 being used to facilitate such electrical connection as in the case of the multi-media card 54. If the leadframe 10 is used in the multi-media card 60, the SMT subassembly 26 will be conductively bonded directly to the corresponding die pad 14 of the leadframe 10. As will be recognized, in this configuration, the leadframe 10 will be modified such that at least one of the traces 18 is integrally connected to the die pad 14 to which the SMT subassembly 26 is conductively bonded. If the leadframe 10A is used in the multi-media card 60, the SMT subassembly 26 may be conductively bonded directly to one or more of the traces 18 thereof. In this regard, the leadframe 10A will be modified such that one or more of the traces 18A extends beyond the die pad 14A, thus providing a suitable space or area for the conductive bonding of the SMT subassembly 26 to such trace(s) 18A.

Referring now to FIG. 5, there is shown a multi-media card 62 constructed in accordance with a fourth embodiment of the present invention. The multi-media card 62 includes the leadframe 10A described above. In addition to the leadframe 10A, the multi-media card 62 includes a die stack 64 which is mounted to the top surface of the die pad 14A of the leadframe 10A. The die stack 64 comprises the semiconductor die 22 and the SMT subassembly 26 which is mounted directly to the top surface of the semiconductor die 22. As will be recognized, the bottom surface of the semiconductor die 22 is mounted directly to the top surface of the die pad 14A. Subsequent to the mounting of the die stack 64 to the die pad 14A, at least one of the pads or terminals of the semiconductor die 22 is electrically connected to the leadframe 10A via at least one conductive wire 24. Similarly, at least one of the pads or terminals of the substrate of the SMT subassembly 26 of the die stack 64 is electrically connected to at least one of the traces 18A of the leadframe 10A via a conductive wire 24.

The multi-media card 62 further includes a body 66 which is formed in the manner described above in relation to the body 46 and the body 56. In the completed multi-media card 62, the bottom surfaces of the contacts 16A of the leadframe 10A are exposed in the bottom surface 68 of the body 66. As shown in FIG. 5, the body 66 is of sufficient thickness such that the die stack 64 and conductive wires 24 are completely covered or encapsulated thereby.

Referring now to FIG. 6, there is shown a multi-media card 68 constructed in accordance with a fifth embodiment of the present invention. The multi-media card 68 is substantially similar in construction to the multi-media card 62 of the fourth embodiment described above, with the distinction being that the die stack 64 is substituted with the above-described die stack 30. In this regard, the die stack 30 is attached to the top surface of the die pad 14A of the leadframe 10A. In the multi-media card 68, at least one conductive wire 24 is used to electrically connect a pad or terminal of the first semiconductor die 32 of the die stack 30 to the leadframe 10A.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card comprising:
   a leadframe having:
   first and second die pads; and
   a plurality of contacts;
   a semiconductor die attached to the first die pad and in electrical communication with at least one of the contacts of the leadframe;

an electronic component attached to the second die pad and in electrical communication with at least one of the contacts of the leadframe; and a body at least partially encapsulating the leadframe, the semiconductor die and the electronic component such that the contacts are exposed in a bottom surface defined by the body.

2. The memory card of claim 1 wherein the electronic component is selected from the group consisting of:
a surface mount technology subassembly;
a chip array structure; and
a land grid array structure.

3. The memory card of claim 1 wherein at least one conductive wire is used to facilitate the electrical communication between the semiconductor die and at least one of the contacts of the leadframe.

4. A memory card comprising:
a leadframe having:
first and second die pads;
a plurality of contacts; and
a plurality of conductive traces extending from respective ones of the contacts toward the first and second die pads;
a semiconductor die attached to the first die pad and electrically connected to the leadframe;
a surface mount technology subassembly attached to the second die pad and electrically connected to the leadframe; and
a body at least partially encapsulating the leadframe, the semiconductor die and the surface mount technology subassembly such that the contacts are exposed within a bottom surface defined by the body.

5. The memory card of claim 4 wherein at least two conductive wires are used to electrically connect the semiconductor die and the surface mount technology subassembly to respective ones of at least two of the conductive traces of the leadframe.

6. The memory card of claim 4 wherein:
the first and second die pads each define opposed, generally planar top and bottom surfaces;
each of the contacts defines opposed, generally planar top and bottom surfaces;
the semiconductor die is attached to the top surface of the first die pad;
the surface mount technology subassembly is attached to the top surface of the second die pad;
the bottom surfaces of the first and second die pads and the bottom surfaces of the contacts extend along respective ones of a spaced, generally parallel pair of frame planes; and
the bottom surfaces of the contacts are exposed in and substantially flush with the bottom surface of the body.

7. The memory card of claim 4 wherein at least one conductive wire is used to electrically connect the semiconductor die to at least one of the conductive traces of the leadframe.

8. A memory card comprising:
a leadframe having:
at least one die pad;
a plurality of contacts; and
a plurality of conductive traces extending from respective ones of the contacts toward the die pad;
a semiconductor die attached to the die pad and electrically connected to the leadframe;
a surface mount technology subassembly attached to the die pad and electrically connected to the leadframe; and
a body at least partially encapsulating the leadframe, the semiconductor die, and the surface mount technology subassembly such that the contacts are exposed within a bottom surface defined by the body.

9. The memory card of claim 8 wherein at least one conductive wire is used to electrically connect the semiconductor die to at least one of the conductive traces of the leadframe.

10. The memory card of claim 8 wherein at least two conductive wires are used to electrically connect the semiconductor die and the surface mount technology subassembly to at least one of the conductive traces of the leadframe.

11. The memory card of claim 8 wherein:
the die pad defines opposed, generally planar top and bottom surfaces;
each of the contacts defines opposed, generally planar top and bottom surfaces;
the semiconductor die and the surface mount technology subassembly are each attached to the top surface of the die pad;
the bottom surface of the die pad and the bottom surfaces of the contacts extend along respective ones of a spaced, generally parallel pair of frame planes; and
the bottom surfaces of the contacts are exposed in and substantially flush with the bottom surface of the body.

12. A media memory card comprising;
a leadframe having:
at least one die pad;
a plurality of contacts; and
a plurality of conductive traces extending from respective ones of the contacts toward the die pad;
at least one electronic component attached to the die pad, the electronic component being electrically connected to the leadframe; and
a body at least partially encapsulating the leadframe and the electronic component such that the contacts are exposed in a bottom surface defined by the body.

13. The memory card of claim 12 wherein the electronic component is a die stack which comprises:
a semiconductor die defining opposed, generally planar top and bottom surfaces; and
a surface mount technology subassembly attached to the top surface of the die stack.

14. The memory card of claim 13 wherein at least two conductive wires are used to electrically connect the semiconductor die and the surface mount technology subassembly to at least one of the conductive traces of the leadframe.

15. The memory card of claim 12 wherein the die stack comprises:
a first semiconductor die;
a second semiconductor die; and
an interposer disposed between the first and second semiconductor dies;
the first and second semiconductor dies each being electrically connected to the interposer.

16. The memory card of claim 15 wherein at least two conductive wires are used to electrically connect the first and second semiconductor dies to the interposer.

17. The memory card of claim 16 wherein the conductive wires are electrically connected to a conductive pattern of the interposer.

18. The memory card of claim 16 wherein at least one conductive wire is used to electrically connect the first semiconductor die to at least one of the conductive traces of the leadframe.

19. The memory card of claim 12 wherein:

the die pad defines opposed, generally planar top and bottom surfaces;

each of the contacts defines opposed, generally planar top and bottom surfaces;

the electronic component is attached to the top surface of the die pad;

the bottom surfaces of the die pad and the contacts extend along respective ones of the spaced, generally parallel pair of frame planes; and the bottom surfaces of the contacts are exposed in and substantially flush with the bottom surface of the body.

20. The memory card of claim 12 wherein:

the leadframe has first and second die pads;

the first die pad defines opposed, generally planar top and bottom surfaces;

each of the contacts defines opposed, generally planar top and bottom surfaces;

a semiconductor die is attached to the top surface of the first die pad;

the bottom surfaces of the first die pad and the contacts extend along respective ones of a spaced, generally parallel pair of frame planes;

the second die pad is bent in a manner facilitating the formation of a cavity therein, the electronic component being attached to the second die pad and at least partially disposed within the cavity which is sized and configured such that the electronic component does not protrude beyond the bottom surface of the first die pad; and the bottom surfaces of the contacts are exposed in and substantially flush with the bottom surface of the body.

* * * * *